United States Patent
Theuss et al.

(10) Patent No.: US 7,836,764 B2
(45) Date of Patent: Nov. 23, 2010

(54) ELECTRICAL DEVICE WITH COVERING

(75) Inventors: Horst Theuss, Wenzenbach (DE);
Albert Auburger, Karlstein (DE); Terje Skog, Nykirke (NO); Jean Schmitt, Zeitlarn (DE)

(73) Assignee: Infineon Technologies AG, Neubiberg (DE)

( * ) Notice: Subject to any disclaimer, the term of this patent is extended or adjusted under 35 U.S.C. 154(b) by 616 days.

(21) Appl. No.: 11/732,433

(22) Filed: Apr. 2, 2007

(65) Prior Publication Data

US 2008/0236278 A1 Oct. 2, 2008

(51) Int. Cl.
*G01D 11/24* (2006.01)
(52) U.S. Cl. ......................................................... 73/431
(58) Field of Classification Search .................. 73/431; 53/499, 500; 438/106, 26, 111, 112; 257/678, 257/684, 685; 374/208
See application file for complete search history.

(56) References Cited

U.S. PATENT DOCUMENTS

| | | | |
|---|---|---|---|
| 5,616,863 A | 4/1997 | Koen | 73/493 |
| 5,907,902 A | 6/1999 | Weyerman | 29/827 |
| 6,045,712 A | 4/2000 | Yarbrough et al. | 216/2 |
| 6,181,473 B1 * | 1/2001 | Fujita et al. | 359/621 |
| 6,316,840 B1 * | 11/2001 | Otani | 257/787 |
| 6,809,413 B1 | 10/2004 | Peterson et al. | 257/680 |
| 6,946,320 B2 * | 9/2005 | Sunwoo et al. | 438/106 |
| 2004/0238943 A1 * | 12/2004 | Fujii | 257/704 |
| 2006/0169049 A1 | 8/2006 | Matsubara | 73/754 |
| 2008/0053254 A1 * | 3/2008 | Reichenbach et al. | 73/866.5 |

FOREIGN PATENT DOCUMENTS

| | | | |
|---|---|---|---|
| JP | 10253652 A | * | 9/1998 |
| JP | 2001044228 A | * | 2/2001 |

* cited by examiner

*Primary Examiner*—Hezron Williams
*Assistant Examiner*—Tamiko D Bellamy
(74) *Attorney, Agent, or Firm*—Dicke, Billig & Czaja, PLLC

(57) ABSTRACT

The invention relates to a device comprising a sensor chip and a structure housing the sensor chip. The structure is covered by a mold compound and is fabricated from a ceramic or a glass material.

29 Claims, 4 Drawing Sheets

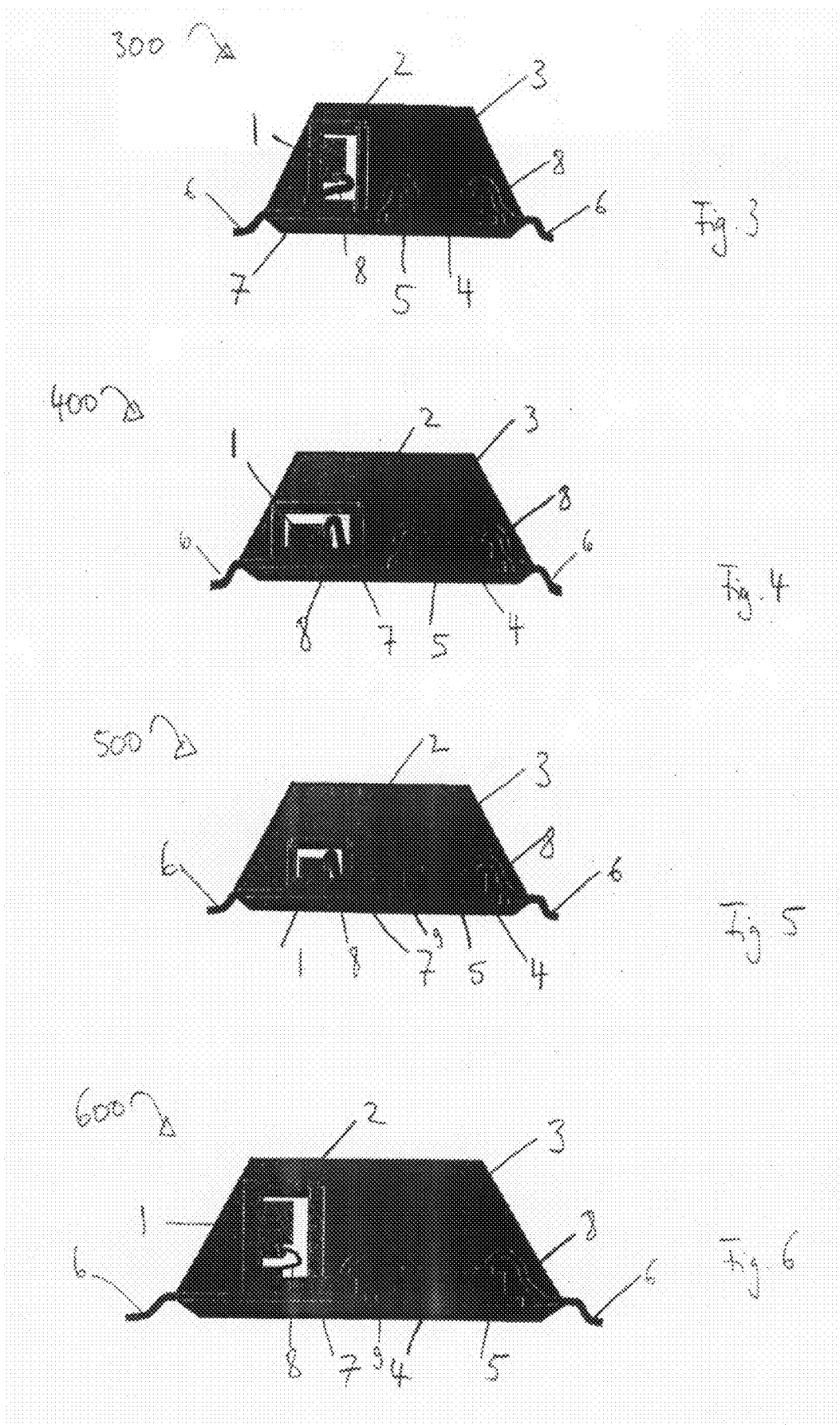

ELECTRICAL DEVICE WITH COVERING

FIELD OF THE INVENTION

This invention relates to an electrical device in general and more particularly to a sensor chip.

BACKGROUND OF THE INVENTION

Sensors are used in everyday life. Applications include automobiles, machines, aerospace, medicine, industry and robotics. Technological progress allows more and more sensors to be manufactured on the microscopic scale included in semiconductor chips.

BRIEF DESCRIPTION OF THE SEVERAL VIEWS OF THE DRAWINGS

Aspects of the invention are made more evident by way of example in the following detailed description of embodiments when read in conjunction with the attached figures, wherein:

FIG. 3 shows a sectional side view of a device including a sensor and a semiconductor chip covered by a structure;

FIG. 4 shows a sectional side view of a device including a sensor and a semiconductor chip in which the sensor is oriented parallel with a surface of a carrier;

FIG. 5 shows a sectional side view of a device including a sensor and a semiconductor chip in which a contact element is disposed on an outer surface of a structure;

FIG. 6 shows a sectional side view of a device including a sensor and a semiconductor chip in which a contact element is a metallization later applied to a structure and bonded to the semiconductor chip;

DETAILED DESCRIPTION OF THE INVENTION

Figure 1:
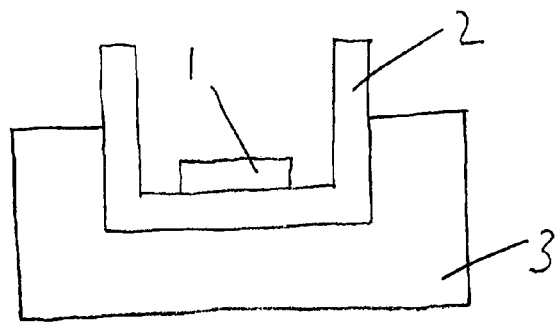
FIG. 1 shows a sectional side view of a device including a sensor disposed in a structure.

In the following embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of embodiments of the invention. It may be evident, however, to one skilled in the art that one or more aspects of the embodiments of the invention may be practiced with a lesser degree of these specific details. In other instances, known structures and devices are shown in block diagram form in order to facilitate describing one or more aspects of the embodiments of the invention. The following description is therefore not to be taken in a limiting sense, and the scope of the invention is defined by the appended claims.

The devices described in the following contain sensor chips. The specific embodiment of these sensor chips is not important in this case. The sensor chips may contain electromechanical or electrooptical functional elements. An example of an electromechanical sensor is a microphone. Examples of electrooptical sensors include photodiodes or diode lasers. The sensor chips may also function fully electrically, for example, as Hall Effect sensors. The sensor chips may be embodied as so-called MEMS (Micro-Electro-Mechanical System), wherein micromechanical movable structures such as, for example, bridges, membranes or reed structures may be provided. Such sensor chips may be motion sensors, which may be embodied as acceleration sensors (detecting accelerations in different spatial directions) or rotation sensors. Sensors of this type are also referred to as gyrosensors, roll-over sensors, impact sensors, inertial sensors, etc. They are used for example in the automotive industry for signal detection in ESP (Electronic Stability Program) systems, ABS (Anti-lock Braking Systems), airbags and the like. Usually such sensor chips are made of a semiconductor material. However, the sensor chips are not limited to be fabricated from a specific semiconductor material. They may additionally contain non-conductive inorganic and/or organic materials.

The described devices further contain a structure housing the sensor chip. The structure may be made of a ceramic or a glass material or combinations thereof. For example, the structure may be fabricated using cofired ceramic multilayer structures, which may contain (depending on the respective application) up to 40 or more dielectric layers. Between adjacent layers electrically conductive vias may be arranged. For example, the layers may contain metallized traces or solder-filled vias, which are conventionally made by thick-film metallization techniques including screen-printing. Using such techniques, the structure housing the sensor chip may then contain one or more contact elements providing an electrical connection through the walls of the structure. Including contact pads on the inner and outer surface of the structure, an electrical connection between applications inside and outside the structure can be established.

During the fabrication process, the multiple layers may be joined together by a burnout process (at about 350° C.-600° C.), which is followed by a firing process at elevated temperatures (depending on the applied materials). Conventionally used systems are low temperature cofired ceramic (LTCC) or high temperature cofired ceramic (HTCC) multilayered systems. HTCC systems may be fabricated by using aluminum substrates; they are printed with molybdenum-manganese or tungsten conducting traces and are fired at temperatures of about 1300° C.-1800° C. For LTCC systems various glass-ceramic substrates are used, which are printed with gold, silver or copper metallizations and are fired at temperatures of about 600° C.-1300° C.

The structure housing the sensor chip may have a thermal expansion coefficient similar or close to the thermal expansion coefficient of the sensor chip. The structure may be of optional shape and geometric form, it may particularly be sealed, for example, by a cover also fabricated from a ceramic or glass material. The structure housing the sensor chip and the cover sealing the structure may also be fabricated from other materials than ceramic or glass if these materials have thermal expansion coefficients in the range from $0.3 \cdot 10^{-6}$/K to $8.2 \cdot 10^{-6}$/K and, in particular, in the range from $4.0 \cdot 10^{-6}$/K to $4.5 \cdot 10^{-6}$/K.

Devices described herein further contain a mold compound that partly or fully covers the structure housing the sensor chip. Said mold compound may, for example, be made of a thermoplastic resin or a thermosetting plastic (e.g. epoxy resin).

The devices may further comprise a semiconductor chip, which may serve to control the functionality of the sensor chip or to process signals that are sensed and/or generated by the sensor chip. By way of example, in the case of the sensor chip being a motion sensor, the deflection of a movable element comprised in the sensor chip may be read piezoresistively or capacitively and may then be processed by the semiconductor chip. The semiconductor chip may be coupled to the sensor chip for the purpose of a (bidirectional) data exchange. The semiconductor chip may, for example, be embodied as an ASIC (Application Specific Integrated Circuit).

FIG. 1 shows a sectional side view of a device 100 as a first embodiment. The device 100 contains a sensor chip 1 housed in a structure 2 made of a ceramic or a glass material. The structure 2 is covered by a mold compound 3. In the illustrated case, the mold compound 3 only partly covers the structure 2 and does not fully enclose it.

Figure 2:
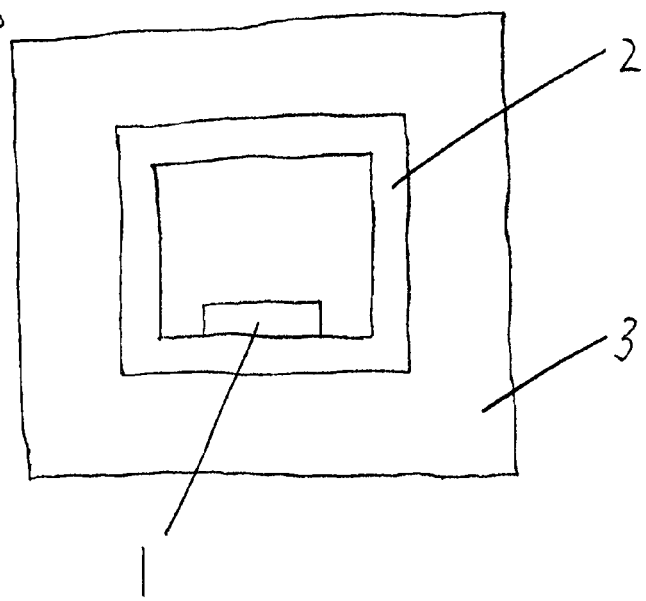
FIG. 2 shows a sectional side view of a device including a sensor fully covered by a structure.

FIG. 2 shows a sectional side view of a device 200 as a second embodiment. In comparison to the device 100 of FIG. 1, the structure 2 of the device 200 fully encapsulates the sensor chip 1. The structure 2 itself is covered by the mold compound 3. As for the device 100, the structure 2 of the device 200 may be fabricated from a ceramic or a glass material. Furthermore, the structure 2 may also be fabricated from a semiconductor material or any other material having a thermal expansion coefficient in the range from $0.3 \cdot 10^{-6}$/K to $8.2 \cdot 10^{-6}$/K and, in particular, in the range from $4.0 \cdot 10^{-6}$/K to $4.5 \cdot 10^{-6}$/K.

FIGS. 3 to 7 illustrate devices 300 to 700 representing further implementations of the devices 100 and 200 described above. The configurations of the devices 300 to 700, which are described in the following, can therefore likewise be applied to the devices 100 and 200.

FIG. 3 shows a sectional side view of a device 300 as a third embodiment. FIG. 3, as well as FIGS. 4-7, includes components similar to those that are positioned and connected as shown, in one implementation, in the steps depicted in FIG. 8 (although FIG. 8 literally shows the fabrication of a device 500 illustrated in FIG. 5). In comparison to the devices 100 and 200, the device 300 further comprises a semiconductor chip 4. The semiconductor chip 4 may, for example, be an ASIC that processes signals received from the sensor chip 1. The semiconductor chip 4 may also control the sensor chip 1. In the implementation of FIGS. 3-6, the sensor chip 1 is mounted in the structure 2, but the semiconductor chip 4 is not. The semiconductor chip 4 and the structure 2 are both mounted on a carrier 5, 6. In the case of the device 300, the carrier 5, 6 is implemented in form of a leadframe comprising at least one die pad 5 and several leads 6 (or pins) surrounding the die pad 5. The die pad 5 and the leads 6 may be fabricated from a metal, for example, copper. Due to the chosen perspective, FIG. 3 only shows two leads 6. In practice, the number of leads 6 for example depends on the number of electrical contacts of the semiconductor chip 4 and/or the sensor chip 1. In the example of FIG. 3, the semiconductor chip 4 is placed on the die pad 5, whereas the structure 2 containing the sensor chip 1 is placed on some of the leads 6. Alternatively, the structure 2 may be mounted on a separate die pad. It is however understood that the carrier 5, 6 is not restricted to embodiments as described above.

The structure 2, the semiconductor chip 4, and the die pad 5 are completely embedded in a mold compound 3, while portions of the leads 6 protrude out of the mold compound 3. The portions of the leads 6 that are not covered by the mold compound 3 may be bent as illustrated in FIG. 3.

The structure 2 further comprises a contact element 7 having contact pads on its inner and outer surface. Inside the structure 2, the contact element 7 is electrically coupled to the sensor chip 1 via a bond wire 8. In the embodiment shown in FIG. 3, the structure 2 is placed on one of the leads 6 in such a manner that the contact element 7 is in direct contact with one of the leads 6. A good electrical contact between the contact element 7 and the lead 6 may be assured by joining the contact element 7 with the lead 6 using electrically conductive glue or by soldering the contact element 7 with the lead 6.

The contact element 7 provides the possibility of an electrical connection through the structure 2. The semiconductor chip 4 is connected to several leads 6 via bond wires 8. One of these bond wires 8 is connected to the lead 6 the contact element 7 is connected to. This bond wire 8 establishes an electrical connection between the sensor chip 1 and the semiconductor chip 4. Accordingly, a bidirectional data exchange between the sensor chip 1 and the semiconductor chip 4 is possible. It is to be noted that the structure 2 may comprise more than one contact element 7 and that the structure 2 (and thus the sensor chip 1) may be coupled to the semiconductor chip 4 via several bond wires 8.

Further, it is to be noted that the sensor chip 1 and the semiconductor chip 4 do not necessarily have to be wire bonded, alternative types of mounting, such as flip-chip technology, may be also used. Since the leads 6 protrude out of the mold compound 3, they provide the possibility of the semiconductor chip 4 and the sensor chip 1 being connected to an external system, for instance, a circuit board.

One advantage of housing the sensor chip 1 in the structure 2 and covering the structure 2 with the mold compound 3 is that stress effects on the sensor chip 1 are reduced. The reason is that the thermal expansion coefficient of the structure 2 made of a ceramic or glass material is similar to the thermal expansion coefficient of the sensor chip 1. Accordingly, signals sensed and/or generated by the sensor chip 1 and thus the overall functionality of the device are less influenced by stress effects. Due to their sensitivity, such influences on the sensing process may particularly be considerable in the case of MEMS and Hall Effect sensor chips.

It is to be noted that, in principle, any material may be used for the fabrication of the structure 2 if the thermal expansion coefficient of the chosen material matches the thermal expansion coefficient of the sensor chip 1. In practice, the thermal expansion coefficient of the structure 2 preferably lies in the range from $0.3 \cdot 10^{-6}$/K to $8.2 \cdot 10^{-6}$/K. It is however understood that the material composition and embodiment of the structure 2 should be related to the respective case.

Housing the sensor chip 1 within the structure 2 further reduces the risk of the bond wires 8, which are connected to the sensor chip 1, being damaged. As can be seen in FIG. 3, due to the complete enclosure of the sensor chip 1 and the bond wires 8 to the sensor chip 1 by the structure 2, the mold compound 3 does not contact the bond wires 8 and therefore no stress effects between these components can occur. In case of a hermetically sealed structure 2, the sensor chip 1 and the bond wires 8 housed in the structure 2 are protected against any kind of undesired environmental influences, such as intruding moisture.

The sensor chip 1 may be produced on a semiconductor wafer with microstructures applied on the semiconductor wafer via planar techniques. Therefore the sensing unit of the sensor chip 1, such as movable elements in the case of a MEMS, is oriented within a main surface of the sensor chip 1. For example, a micromechanical movable membrane used for sensing of an acceleration is usually oriented parallel to the main surface of the sensor chip 1.

Figure 8:
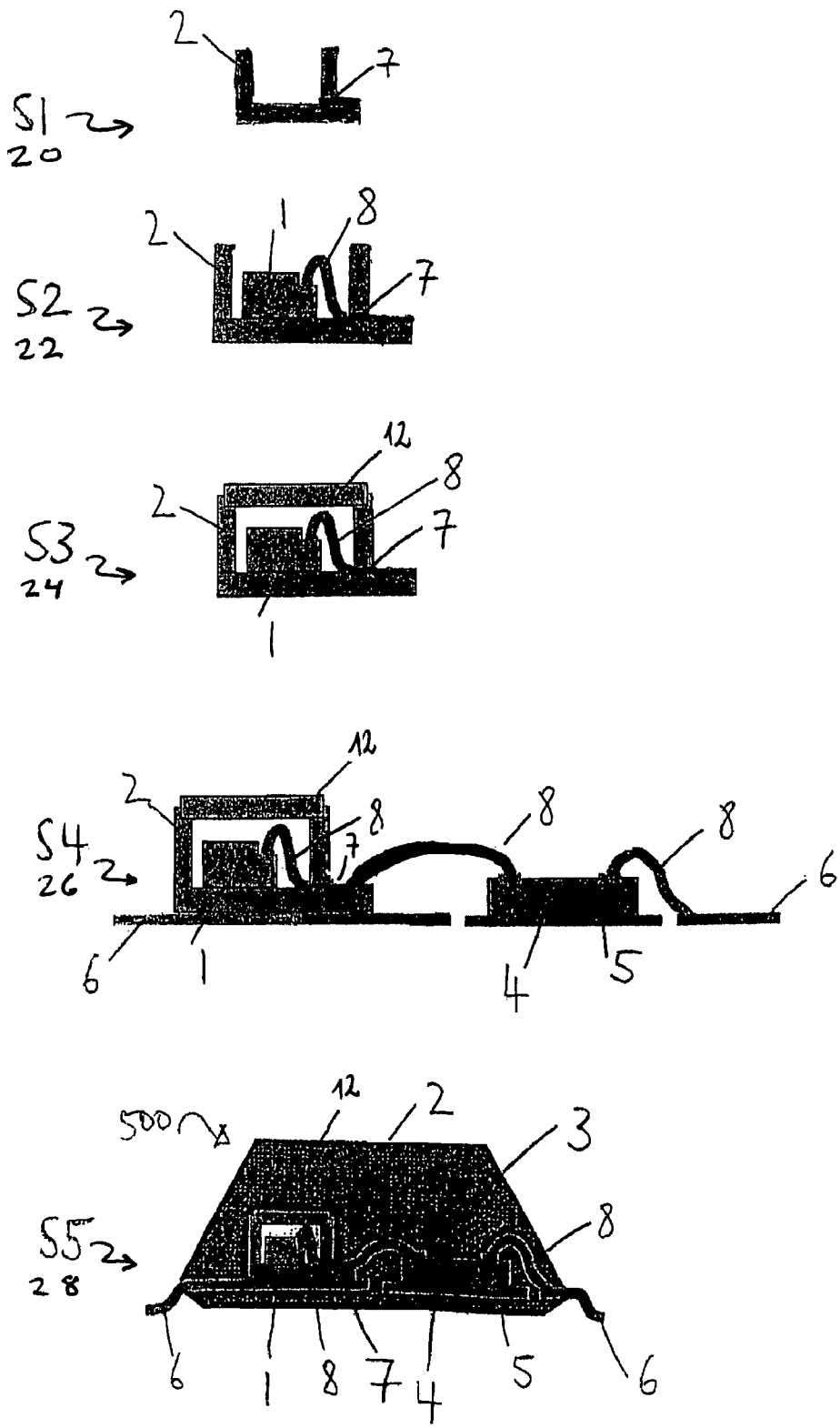
FIG. 8 shows fabrication steps to fabricate an embodiment of the device.

In some cases, the physical value to be sensed by the sensor chip 1 may depend on the spatial orientation of its main surface, for example, when various spatial components of an acceleration are to be detected. In the device 300, the structure 2 is mounted onto the carrier 5, 6 in such a way that the spatial orientation of the sensor chip 1, i.e. its main surface, supports the functional requirements of the device 300. In FIG. 3, the main surface of the sensor chip 1 and the surface of the carrier 5, 6 are tilted by a tilt angle of about 90°. (In FIG. 8, previously referenced, the tilt angle of the sensor chip 1 to the surface of the carrier 5, 6 is 0°; in FIG. 4, the sensor chip is mounted at a tilt angle approximately 0° as shown in FIG. 8.) It is however understood that the main surface of the sensor chip 1 and the surface of the carrier 5, 6 can be arranged with any tilt angle. The tilt angle should be chosen in agreement with the desired functionality of the device 300.

FIG. 4 shows a sectional side view of a device 400 as a fourth embodiment. In contrast to the device 300, the structure 2 contained in the device 400 is placed on the carrier 5, 6 in such a manner that the main surface of the sensor chip 1 is oriented parallel to the surface of the carrier 5, 6. In case of the device 400, there is no tilt angle between the main surface of the sensor chip 1 and the surface of the carrier 5, 6.

FIG. 5 shows a sectional side view of a device 500 as a fifth embodiment. The difference between the devices 400 and 500 lies within the respective design of their contact elements 7. The contact element 7 of the device 400 is in direct contact with one of the leads 6, whereas the contact element 7 of the device 500 is arranged on an outer surface of the structure 2, which does not contact the carrier 5, 6. In this way, an electrical connection between the contact element 7 and the semiconductor chip 4 can be established via a bond wire 9, one end of which is attached to the contact element 7 and the other end of which is attached to the semiconductor chip 4. The bond wire 9 does not contact the carrier 5, 6. As a result, the additional connection between the contact element 7 and the lead 6 (cf. FIG. 4) is omitted.

FIG. 6 shows a sectional side view of a device 600 as a sixth embodiment. The device 600 differs from the device 300 in the way the contact element 7 is designed. In FIG. 6, the contact element 7 is a metallization layer which is applied to the structure 2. Moreover, the contact element 7 is directly wire bonded to the semiconductor chip 4.

Figure 7A:
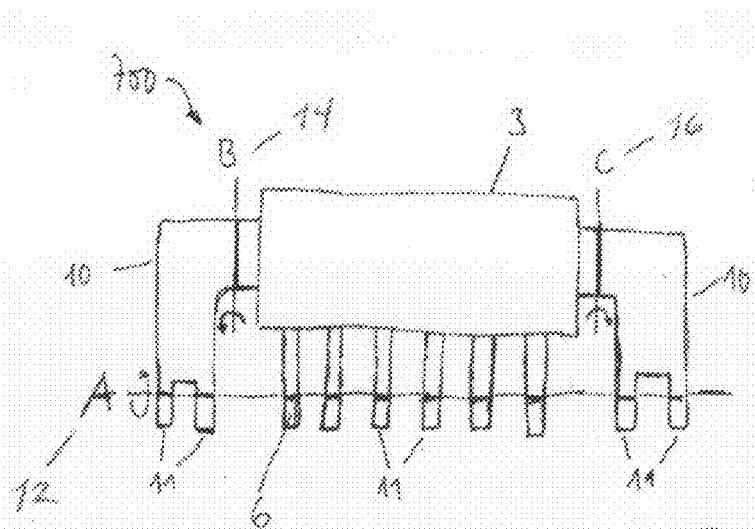
FIG. 7A shows a top plan view of a device including a structure covering one or more devices.
Figure 7B:
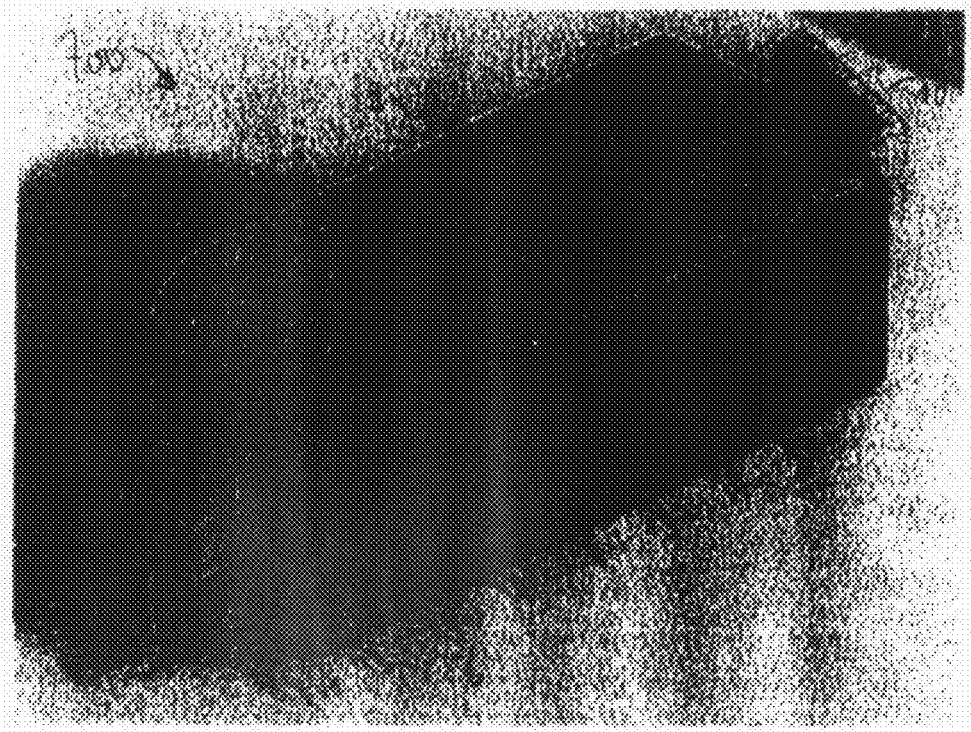
FIG. 7B shows a perspective view of the device of FIG. 7A.

FIG. 7A shows a top plan view of a device 700 as a seventh embodiment. FIG. 7B shows another view of the device 700. The internal structure of the device 700 may be the same as the internal structure of one of the devices 300 to 600. Due to the chosen perspective of FIG. 7A, the internal structure of the device 700, such as the sensor chip 1, the structure 2 and the semiconductor chip 4, are not shown. The visible components of the device 700 are the mold compound 3 and the portions of leads 6 and 10 protruding out of the mold compound 3. The device 700 has leads not on four, but only on three sides of the device 700. As indicated in FIG. 7A by an axis A 12, the leads 6 are bent by 90°. Further, each of the two outer leads 10 are bent by 90° in two places (cf. axes A 12, B 14, and C 16). The bending of the leads 6 and 10 results in end points 11 of the leads 6 and 10, lying within a plane. This plane is the mounting plane of the device 700, which can, for example, be used to mount the device onto a circuit board. Since the main surface of the sensor chip 1 lies within the drawing plane of FIG. 7A, the main surface of the sensor chip 1 and the mounting plane of the device 700 are tilted by a tilt angle of 90°. If, for some reason, the circuit board is positioned so as not to be quite perpendicular to the desired attitude of the device, the leads 6 may be bent at a different angle to allow for orienting the device 700 at a desired operating angle. For example, the leads 6 may be bent within +45° to −45° of the circuit board to effect a desired position of the device 700 regardless of the angular position of the circuit board.

Besides a tilt angle between the main surface of the sensor chip 1 and the surface of the carrier 5, 6 as shown in FIGS. 3 and 6, the bending of the leads 6 and 10 as proposed in FIGS. 7A and 7B provides a further possibility to adjust the spatial orientation of the sensor chip 1. It is understood that one or more of the leads 6 and 10 may have further bents. Specifically, the design of the leads 6 and 10 may depend on the external application type as well as on the desired functionality of the device 700.

FIG. 8 illustrates process steps of an exemplary fabrication of the device 500. The components and properties of the device 500 were already described above. In a first step S1 20, a structure 2 made of a ceramic or glass material or any other material having a thermal expansion coefficient in the range from $0.3 \cdot 10^{-6}/K$ to $8.2 \cdot 10^{-6}/K$ is provided. The structure 2 comprises at least one contact element 7 which has contact pads inside and outside of the structure 2. In a second step S2 22, a sensor chip 1 is mounted onto the structure 2, for example by using a conventional die attach method, such as gluing. Furthermore, the sensor chip 1 is electrically connected to the contact element 7 via a bond wire 8. In a third step S3 24, the structure 2 is closed and hermetically sealed with a cover 12, which may be made of the same material as the structure 2.

In a fourth step S4 26, a leadframe comprising a die pad 5 and leads 6 is provided. A semiconductor chip 4 is mounted on the die pad 5 and is electrically connected to the leads 6 via bond wires 8. The step S4 26 further comprises mounting the structure 2 onto the leadframe. This mounting process is not restricted to a certain technique and may for example be carried out by gluing the structure 2 to the leadframe. In a fifth step S5 28, the structure 2 and the semiconductor chip 4 are covered with a mold compound 3 in such a way that portions of the leads 6 protrude out of the mold compound 3. Depending on the type of a possible external application and the desired functionality of the device 500, the leads 6 may be bent accordingly.

It is understood that all devices shown in FIGS. 1 to 7 may be manufactured in a process similar to the one illustrated in FIG. 8. Moreover, the described process steps may be interchanged in any reasonable way. For example, it is possible to perform the step S4 28 before the steps S1 20 to S3 26, i.e. the structure 2 may be mounted onto the carrier 5, 6 first and the steps S1 20 to S3 24 may be performed afterwards with the structure 2 already attached to the carrier 5, 6. It is also to be noted that further fabrication steps may be added to the method illustrated in FIG. 8.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

What is claimed is:

1. A device, comprising:
   a sensor chip; and
   a structure housing the sensor chip and covered by a mold compound, wherein the structure is fabricated from a ceramic or a glass material and the surface of the sensor chip is completely free of the mold compound.

2. The device of claim 1, wherein the structure is mounted to a carrier which is covered by the mold compound.

3. The device of claim 2, wherein the carrier is a leadframe.

4. The device of claim 2, wherein a main surface of the sensor chip and a surface of the carrier are tilted by a tilt angle.

5. The device of claim 4, wherein the tilt angle of 90.degree.

6. The device of claim 1, wherein a contact element is applied to an outer surface of the structure and the contact element is electrically connected to the sensor chip.

7. The device of claim 6, wherein the contact element of the structure is electrically connected to the carrier.

8. The device of claim 1, further comprising a semiconductor chip covered by the mold compound.

9. The device of claim 8, further comprising a wire, an end of is the wire being attached to the contact element of the structure and another end of the wire being attached to the semiconductor chip.

10. The device of claim 1, wherein the structure is sealed.

11. The device of claim 1, further comprising a plurality of leads electrically connected to the sensor chip, wherein a respective end point of each of the leads lies within a plane, and the main surface of the sensor chip and the plane are tilted by a tilt angle.

12. The device of claim 11, wherein each of the leads has a respective bent.

13. The device of claim 11, wherein at least one of the leads has two bents.

14. A method, comprising:
   placing a sensor chip in a structure fabricated from at least one of a ceramic or a glass material and the surface of the sensor chip is completely free of a mold compound; and
   covering the structure with the mold compound.

15. The method of claim 14, wherein the structure is glued to a carrier.

16. The method of claim 15, wherein the sensor chip is placed within the structure, before the structure together with the sensor chip is glued to the carrier.

17. The method of claim 14, wherein a semiconductor chip is attached to the carrier and is covered with the mold compound, before the structure together with the sensor chip is glued to the carrier.

18. A device, comprising:
   a sensor chip; and
   a structure fully encapsulating the sensor chip and covered by a mold compound, wherein the sensor chip is completely free from and does not contact the mold compound, and wherein the thermal expansion coefficient of the structure lies in a range from $0.3 \times 10^{-6}$/K to $8.2 \times 10^{-6}$/K.

19. The device of claim 18, wherein the structure is fabricated from one or more of a ceramic, a glass, or a semiconductor material.

20. The device of claim 18, wherein the structure is mounted to a carrier which is covered by the mold compound.

21. The device of claim 20, wherein a main surface of the sensor chip and a surface of the carrier are tilted by a tilt angle.

22. The device of claim 21, wherein the tilt angle is 90°.

23. The device of claim 18, wherein a contact element is applied to an outer surface of the structure and the contact element is electrically connected to the sensor chip.

24. The device of claim 18, further comprising a semiconductor chip covered by the mold compound.

25. The device of claim 24, further comprising a wire, an end of is the wire being attached to the contact element of the structure and another end of the wire being attached to the semiconductor chip.

26. A method, comprising:
   placing a sensor chip in a structure having a thermal expansion coefficient in a range from $0.3 \times 10^{-6}$/K to $8.2 \times 10^{-6}$/K;
   sealing the structure by placing a cover on the structure; and
   covering the structure with a mold compound, wherein the sensor chip is completely free from and does not contact the mold compound.

27. The method of claim 26, wherein the cover has a thermal expansion coefficient in a range from $0.3 \times 10^{-6}$/K to $8.2 \times 10^{-6}$/K.

28. The method of claim 26, wherein the structure and the cover are fabricated are fabricated from one or more of a ceramic, a glass or a semiconductor material.

29. A device, comprising:
   a sensor chip;
   a semiconductor chip;
   a ceramic or glass structure housing the sensor chip and having a contact element;
   a carrier holding the semiconductor chip and the ceramic or glass structure; and
   a wire, an end of which is attached to the semiconductor chip and the other end of which is attached to the contact element of the ceramic or glass structure; and
   a mold compound encasing the structure housing, the semiconductor chip, and portions of the carrier, wherein the sensor chip is completely free from and does not contact the mold compound.

* * * * *

UNITED STATES PATENT AND TRADEMARK OFFICE
CERTIFICATE OF CORRECTION

PATENT NO.        : 7,836,764 B2
APPLICATION NO.   : 11/732433
DATED             : November 23, 2010
INVENTOR(S)       : Theuss et al.

Page 1 of 1

It is certified that error appears in the above-identified patent and that said Letters Patent is hereby corrected as shown below:

Column 8, line 8, delete "$_6$/K" and insert in place thereof --$^6$/K--.

Column 8, line 29, delete "$_6$/K" and insert in place thereof --$^6$/K--.

Column 8, line 39, delete second occurrence of "are fabricated".

Signed and Sealed this
First Day of March, 2011

David J. Kappos
*Director of the United States Patent and Trademark Office*